United States Patent [19]
Watanabe et al.

[11] Patent Number: 5,093,738
[45] Date of Patent: Mar. 3, 1992

[54] COLOR FILTER MANUFACTURING METHOD USING NEGATIVE PHOTORESIST MATERIAL FOR THE FILTER

[75] Inventors: Hiroshi Watanabe; Kazuo Aoki, both of Suwa, Japan

[73] Assignee: Seiko Epson Corporation, Tokyo, Japan

[21] Appl. No.: 677,533

[22] Filed: Apr. 1, 1991

[30] Foreign Application Priority Data

Apr. 2, 1990 [JP] Japan .................................. 2-87980

[51] Int. Cl.⁵ ........................ G02F 1/133; G02B 5/22
[52] U.S. Cl. ........................................ 359/68; 359/891
[58] Field of Search ........................ 350/339 F, 317

[56] References Cited

U.S. PATENT DOCUMENTS 4,610,509  9/1986  Sorimachi et al. ........... 350/339 F
4,808,501  2/1989  Chiulli ............................ 430/145
4,948,706  8/1990  Sugihara et al. .............. 350/339 F
5,013,138  5/1991  Roosen et al. ................ 350/339 F

FOREIGN PATENT DOCUMENTS 60-48001  3/1985  Japan .
62-9301   1/1987  Japan .

Primary Examiner—Stanley D. Miller
Assistant Examiner—Anita Pellman Gross
Attorney, Agent, or Firm—Blum Kaplan

[57] ABSTRACT

A method of forming a color filter substrate having pixels of at least two different colors by use of a negative photoresist material of the last color deposited. The negative photoresist is coated over the pixels and the exposed surface of the substrate. The back of the substrate is then exposed to a light source at a wavelength blocked by the formed pixels so that any of the negative photoresist material directly on the transparent substrate is activated by the light from the light source and remaining material is removed.

8 Claims, 5 Drawing Sheets

COLOR FILTER MANUFACTURING METHOD USING NEGATIVE PHOTORESIST MATERIAL FOR THE FILTER

BACKGROUND OF THE INVENTION

This invention relates to a method of manufacturing a color filter and, more particularly to a method of manufacturing a color filter for use in liquid crystal display devices.

The use of color displays in liquid crystal display devices is known in the art. Color liquid crystal displays are being used more frequently as computer terminals in view of the rapid advance of liquid crystal technology in recent years. The liquid crystal display devices include two substrates with liquid crystal material disposed therebetween. The inner surface of each substrate has a plurality of parallel ribbon-like electrodes, with the electrode ribbons on one substrate arranged perpendicularly to the electrode ribbons on the other. The areas in the device where the electrodes on one substrate intersect the electrodes of the other substrate are known as pixels.

Within this model, liquid crystal display devices, colorized or not, are usually classified as either utilizing an active matrix system or a simple matrix system. The active matrix system necessitates an active element, such as a thin film transistor (TFT) or diode, at every pixel in the display. The simple matrix system requires only a drive circuit connected to each ribbon-like electrode. The simple matrix system takes advantage of the steep threshold characteristics of certain liquid crystal materials.

Ferroelectric liquid crystal material has such a steep threshold characteristic. It is contemplated that these compounds will be used in liquid crystal display devices employing the simple matrix system. Presently in use is the double-layer super-twisted nematic (STN) system and the film compensating STN system.

In the simple matrix or any display system requiring a steep threshold characteristic, the substrate and any color filters positioned on the substrate must be substantially flat to keep the threshold characteristic uniformly steep over the entire area of the display. If uniformity is not maintained, the picture quality becomes less than completely satisfactory. Thus, it is indispensable that any process for forming the color filter for use in a simple matrix system display device must have a precise flat color filter surface.

Various methods of forming color filters are presently known in the art. These methods include printing, dyeing, and electrodeposition methods. Another method which has been developed within recent years is the color photoresist method. In this method, pigments are dispersed in a negative resist material and formed into patterns by photoresistance. This method is superior to the printing method in positional precision and the flatness of the color filter surface. The method also has better heat resistance and light stability than the dyeing method. Additionally, the photoresist method allows for a greater variety of patterns and is less expensive to manufacture than the electrodeposition process. Recently, problems associated with the photoresist method, including the hue quality and liquid stability, have been solved, thereby increasing the popularity of the photoresist method of forming color filters.

Current methods of forming color filters are less than completely satisfactory. They are still moderately expensive, and the resulting surface of the color filters still is uneven. This leads to variances in the threshold characteristics and less than completely satisfactory picture quality in simple matrix system display devices.

One such photoresist method of forming color filters in shown in FIG. 1. Color resists of different hues are superposed on each interpixel clearances. A plurality of a first formed pixels 102 are formed on a transparent substrate 101. A plurality of a second formed pixels 103 of a color different from first formed pixels 102 are formed on transparent substrate 101 with a plurality of superposed portions 105 overlapping onto first formed pixels 102. A plurality of a third formed pixels 104, different in color from both first formed pixels 102 and second formed pixels 103, are formed on transparent substrate 101 with a plurality of superposed portions 106 and 107 on second formed pixels 103 and first formed pixels 102, respectively. The presence of superposed portions 105, 106 and 107 cause the surface of the color filters to be uneven. In order to achieve a flat surface, another film must be provided on the filters and ground to a flat surface, at additional expense.

Another known photoresist method of forming color filters is shown in FIG. 2. To avoid the overlapping of the prior example, a plurality of black thin shading layers 201 are formed on transparent substrate 101 before the forming of pixels 102, 103 and 104. The surface of the pixels formed are thus flat. However, this method is expensive since thin shading layers 201 are formed by coating the material on substrate 101 by vaporization and patterning by photoetching. Additionally, this method results in interpixel gaps 202 between the color filters, and so, like in the previous method, the film next positioned on the filters will tend to be uneven.

Accordingly, it is desirable to provide a photoresist color filter manufacturing method which overcomes the disadvantages of prior art photoresist methods and is inexpensive and provides a relatively flat color filter surface layer.

SUMMARY OF THE INVENTION

Generally speaking, in accordance with the invention, a method of manufacturing a plurality of color filters of at least two colors for pixels of a liquid crystal display by dispersing pigment in a negative resist material, is provided. All the pixels but one color are formed on a transparent substrate with the pixels spaced apart from each other. A film of negative photoresist material, tinted a hue different than the formed pixels, is coated over the pixels and the top surface of the transparent substrate.

The back of the substrate is exposed to a light source. This light source emits light at an intensity sufficient to react with the negative photoresist material and at a wavelength which is blocked by the hues in each of the formed pixels. The negative photoresist material directly on the transparent substrate is activated by the light from the light source, but the negative photoresist material above the formed pixels is not activated. The activated negative photoresist material is then developed, thereby forming a last set of color pixels among the formed pixels and the undeveloped resist material is removed. The material of the last-formed pixel fills in the spaces between the formed pixels.

Accordingly, it is an object of the invention to provide an improved color filter manufacturing method.

Another object of the invention to provide a color filter manufacturing method which uses photoresist methods.

A further object of the invention is to provide a method of manufacturing color filters which can be used in a liquid crystal display device utilizing the simple matrix system.

Still another object of the invention is to provide a method for manufacturing color filters which have an even surface.

Yet another object of the invention is to provide a color filter manufacturing method which is relatively inexpensive.

Still other objects and advantages of the invention will, in part, be obvious and will, in part, be apparent from the specification.

The invention accordingly comprises the several steps and the relation of one or more of such steps with respect to each of the others, and the article possessing the features, properties and the relation of elements, which will be exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 3A:
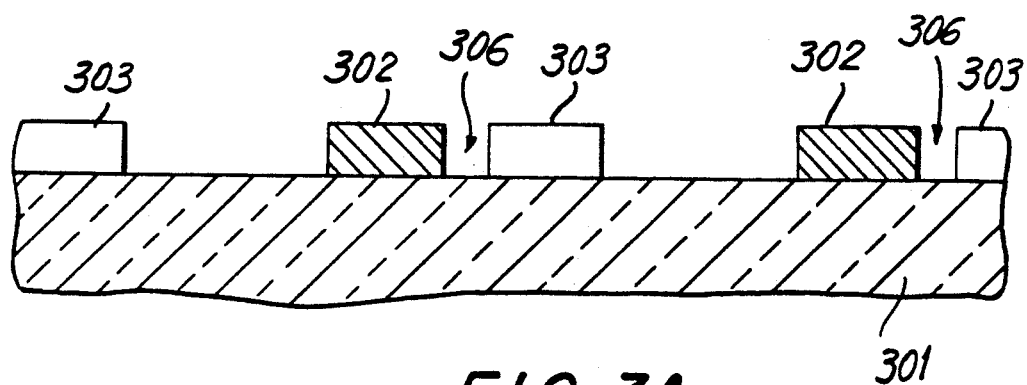
FIGS. 3A, 3B and 3C are cross-sectional views showing the steps for forming a color filter in accordance with the invention.
Figure 3B:
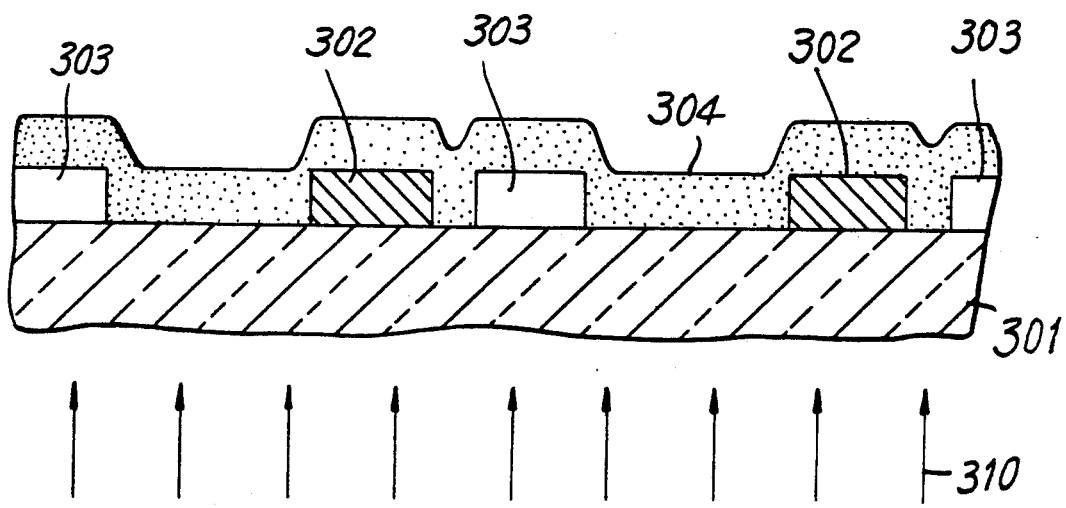
Figure 3C:
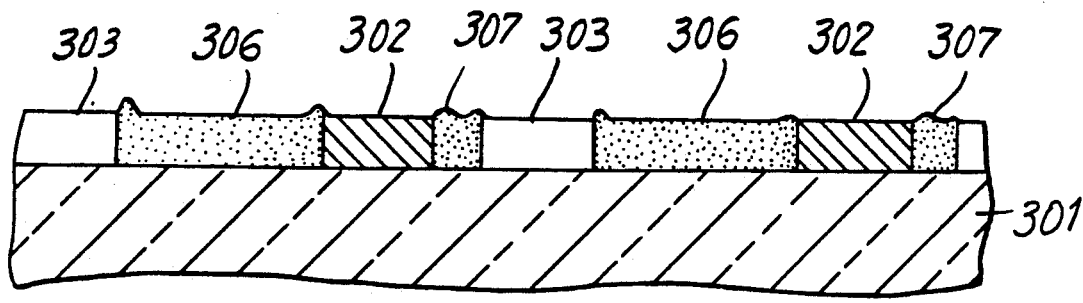

FIGS. 3A, 3B and 3C are sectional views which illustrate the steps of forming a color filter in accordance with the invention. In FIG. 3A, a plurality of a first pixel 302, tinted a first color, and a plurality of a second pixel 303, tinted a second color, are alternatively formed on a transparent substrate 301 by dispersing pigments in negative resist material. The resist materials are applied to transparent substrate 301, and selectively patterned to form first pixels 302 and second pixels 303 by known photoresist techniques. Spaces 306 remaining between adjacent pixels are known as interpixel clearances.

A third pigment is dispersed in a negative resist material and applied as a film 304 across transparent substrate 101 and first and second pixels 302 and 303. The surface of transparent substrate 301 opposite to the color filters is exposed to a light 310. Light 310 is chosen to have a specific wavelength such that the pigments in first and second pixels 302 and 303 substantially block the passage of light 310. Thus, the portion of light 310 which impacts first and second pixels 302 and 303 does not pass through. Film 304 is developed in the presence of light 310 to form a plurality of a third pixel 306 and form interpixel clearance filler 307 between first and second pixels 302 and 303. However, since light 310 cannot pass through first and second pixels 302 and 303, the portion of film 304 directly above first and second pixels 302 and 303 is not developed by light 310, and so that portion of film 304 does not bond and is readily removed.

Figure 1:
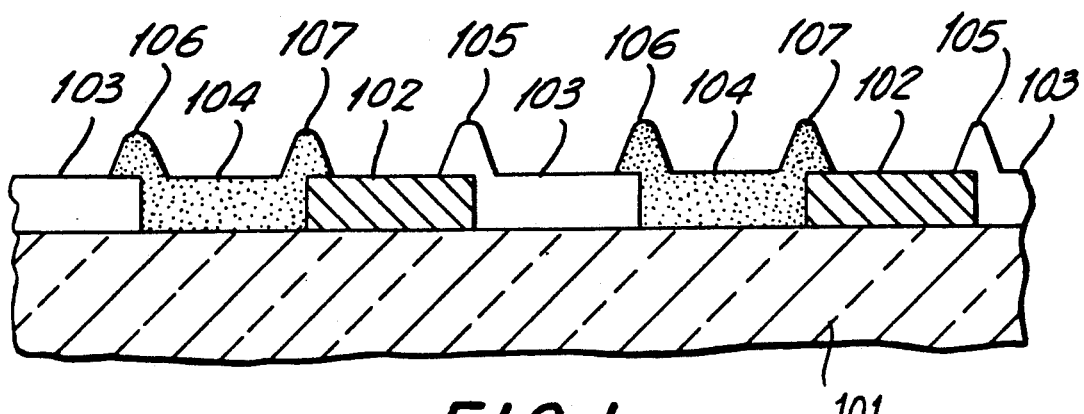
FIG. 1 is a cross-sectional view of color filters prepared in accordance with a conventional process.
Figure 2:
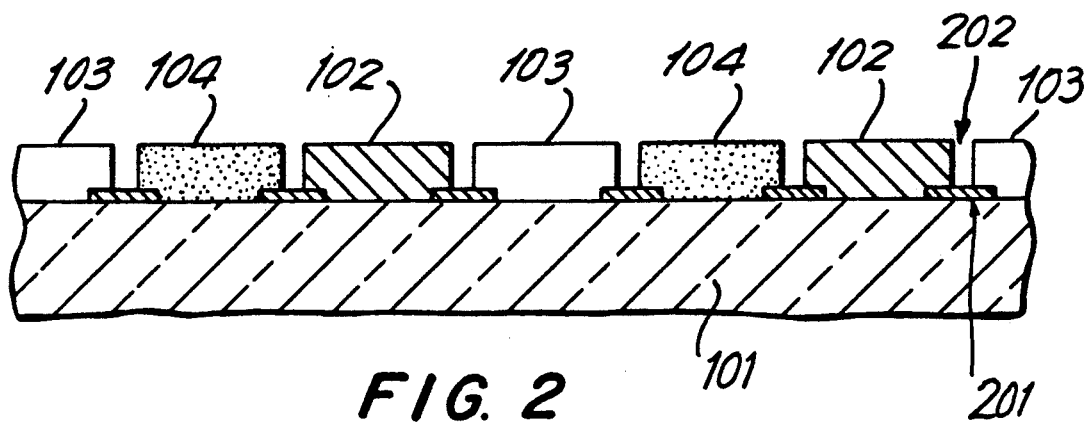
FIG. 2 is a cross-sectional view of color filters prepared in accordance with another conventional process.

The thickness of third pixel 306 and interpixel clearance filler 307 can be adjusted to be level with first and second pixels 302 and 303 by varying such factors as the amount of resist material, intensity of light 310, length of exposure, and the like. In this manner, the surface of the color filters can be made flatter than the prior art techniques used to make filters 106 of FIG. 1 and without gaps in the interpixel clearances as shown in FIG. 2. Thus, the surface of the next layer of film applied on the color filter layer need not be excessively ground to be made flat, and subsequently the cost to manufacture will be less.

Another advantage of the method, which further reduces the expense of manufacture, is that since first and second pixels 302 and 303 act as a filter for light 310, additional masking filters and their inherent precision problems are avoided. In other words, first and second pixels 302 and 303, without any adjustments, are placed in the location where a photomask should be positioned for maximum accuracy. Thus, the formed pixels make ideal photomasks.

The invention has been described for forming color filters having three colors, one of the colors used both as a pixel and interpixel clearance filler. However, it is to be understood that the method in accordance with the invention can be altered to accommodate a two-color filter device. In this case, one color pixel is formed and the second color material is used not only as the second color pixel, but also to fill the spaces between the pixels. The first color pixel is used to mask the light from reaching any of the second color material located on the first formed color pixel. Additionally, the method will apply to more than three color filters as well. In this scenario, all but one of the color pixels are formed, and the last color material is used both as a pixel and to fill the interpixel spaces.

The following examples set forth two embodiments of the invention. These examples are set forth for purposes of illustration of the invention and are not presented in a limiting sense.

EXAMPLE 1

The color resist material used is that marketed by Fuji Hunt Electronics Technology Col., Ltd. under the trade name COLOR MOSAIC. The resist materials have the trade designation of CBV for blue, CRY for red and CGY for green. The negative resist material included in the color resist material was a photosensitive acrylic resin. As the photosensitive acrylic resin was susceptible to oxygen in air, an oxygen block film, marketed by Fuji Hunt Electronics Technology Co., Ltd. under the trade designation CP, was coated on the color resist material before exposure to light. CBV, CRY and CGY were each known to react upon an application of light energy in a range of intensity between about 10 to 30 mj/cm$^2$.

Figure 5A:
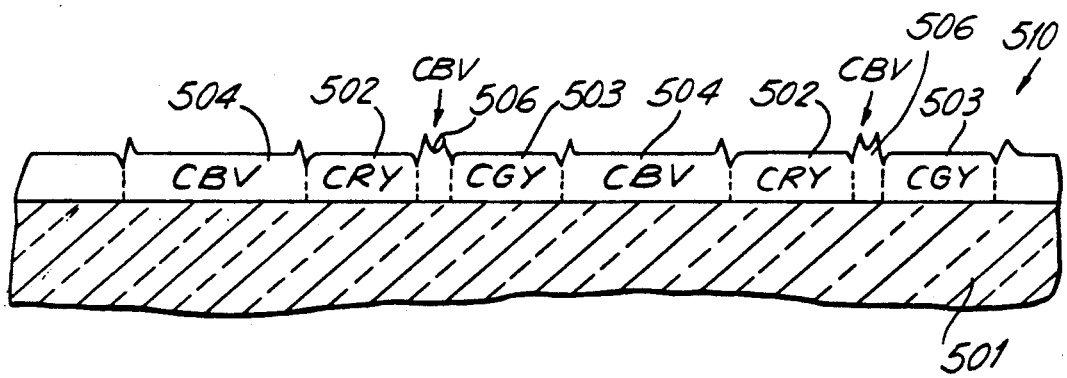
FIGS. 5A and 5B are cross-sectional views of a color filter formed in accordance with the invention.

CRY was coated by a spin coater on a soda glass transparent substrate 501 shown in FIG. 5. The CRY-coated substrate was preheated at 70° C. for two minutes, and then irradiated with UV rays on the CRY-coated side of substrate 501 from an extra-high voltage mercury arc lamp at 10 to 30 mj through a photomask. Next, the film was developed with an alkaline developer (Fuji Hunt Electronics Technology Co., Ltd. under the trade name CD), dried, and burned, leaving red pixels 502 on substrate 501.

The procedure then was repeated using CGY to form green pixels 503 spaced apart 10 to 30μm from red pixels 502.

Figure 4:
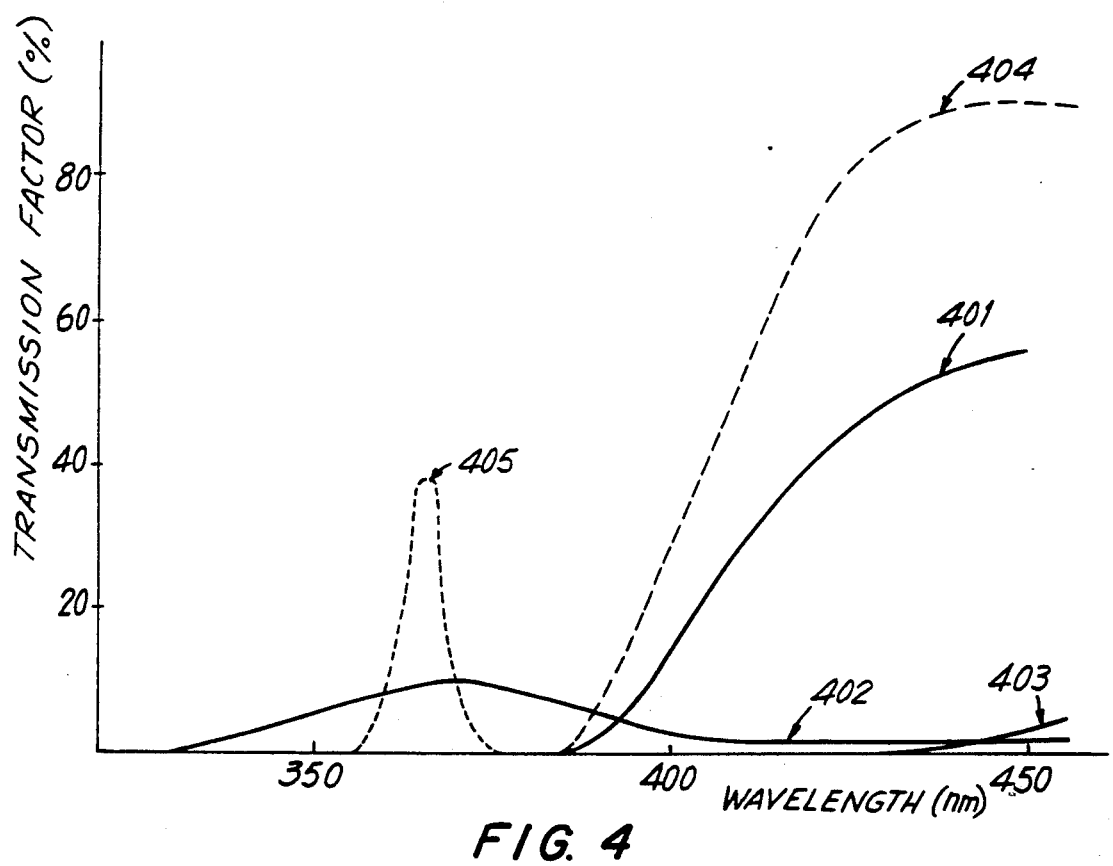
FIG. 4 is a graph of the spectral wavelength of a color filter and filter used at the time of exposure.

Then, CBV was similarly spin-coated onto substrate 501 and preheated at 70° C. for two minutes. However, in order to form blue pixels 504 and interpixel fillers 506 in accordance with the invention, it was necessary to ascertain the transmission factors of CRY and CGY to find a wavelength which would be blocked by the preformed red pixels 502 and green pixels 503. The shortwave spectral transmission factors of CRY and CGY identified as 402 and 403, respectively, are shown in FIG. 4. CRY has photosensitive band 402 between 330 and 415 nm and CGY has photosensitive band 403 between 430 and 450 nm. Accordingly, it was determined that the 365 nm light from an ultra-high voltage mercury arc lamp would be blocked through CGY, but would still pass through CRY. Thus, in order to keep most of the light from passing through CRY, a UV cut filter having the spectral transmission factor indicated by a curve 404 in FIG. 4 was provided half-way between the light source and the transparent substrate.

An additional special photomask was provided between the light source and transparent substrate 501 to mask the outside boundaries of the entire display. Substrate 501 was then irradiated, with the light source shining on the back (the surface not coated with color resist material) so that the light would not reach that portion of CBV coated on CRY and CGY. The amount of radiation was between 20 and 100 mj/cm$^2$ for a substrate with CP coated on the CBV, or 150 and 300 mj/cm$^2$ for a substrate without CP coated on the CBV. In this manner, a device 510 shown in FIG. 5A was obtained, free from the presence of CBV on red pixels 502 and green pixels 503.

Figure 5B:
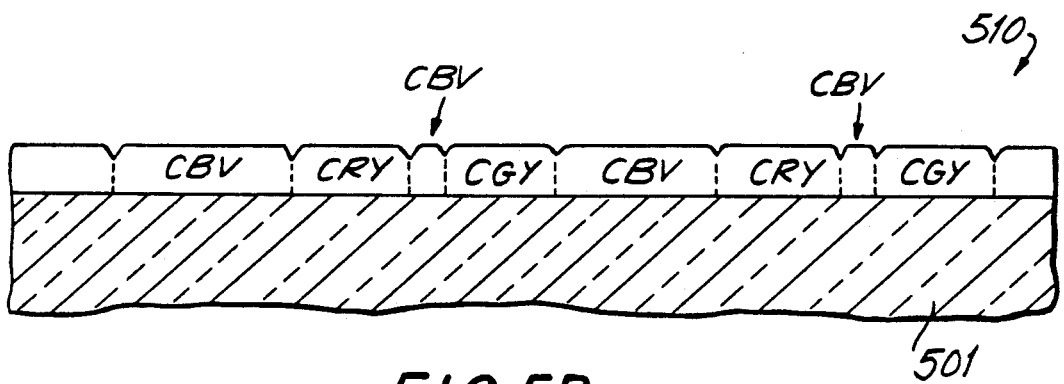

Finally, to eliminate the small projections at the edge of blue pixels 504 and blue interpixel fillers 506, the back of substrate 501 was exposed to 150 to 200 mj/cm$^2$ for the CP-coated device and 20 to 30 mj/cm$^2$ for the CP-free device. The surface of the color filters in resulting device 510, shown in FIG. 5B, is substantially flat. Subsequent layers placed on these color filters do not need extensive grinding to be level.

EXAMPLE 2

The first two color pixels were formed as in Example 1, except the CBV and CGY was used to form blue and green pixels.

Then, CRY was spin-coated onto the substrate and preheated at 70° C. for two minutes. However, in order to form the red pixels and interpixel fillers in accordance with the invention, it was necessary to ascertain the transmission factors of CBV and CGY to find a wavelength which would be blocked by the red and green pixels. The shortwave spectral transmission factors of CBV and CGY, designated 401 and 403, respectively, are shown in FIG. 4. CBV has a photosensitive band between 380 and 450 nm, and, as noted in Example 1, CGY has a photosensitive band between 430 and 450 nm. To insure that the 365 nm light from an ultra-high voltage mercury arc lamp would be blocked by CBV and CGY, a UV cut filter having the spectral transmission factor indicated at 405 in FIG. 4 was provided half-way between the light source and the transparent substrate.

In additional, a special photomask was provided between the light and transparent substrate to mask outside the boundaries of the entire display. The substrate was then irradiated, with the light source shining on the back (the surface not coated with color resist material) so that the light would reach that portion of CRY coated on CBV and CGY. The amount of radiation was between 15 and 100 mj/cm$^2$ for a substrate with CP coated on the CRY, or 120 and 300 mj/cm$^2$ for a substrate without CP coated on the CRY. In this manner, a device was obtained which was free from the presence of CRY on the blue and green pixels and substantially flat on the surface of the color filters.

Figure 6:
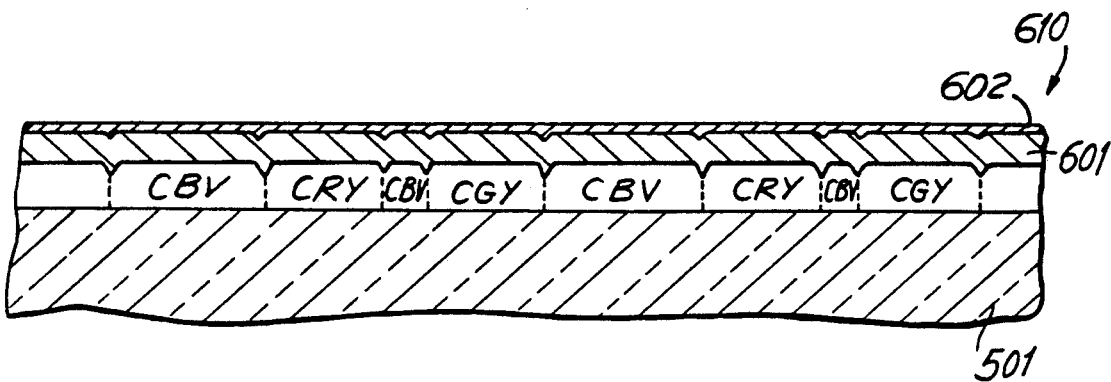
FIG. 6 is a cross-sectional view of a color filter electrode substrate for a liquid crystal display device formed in accordance with the invention.
Figure 7:
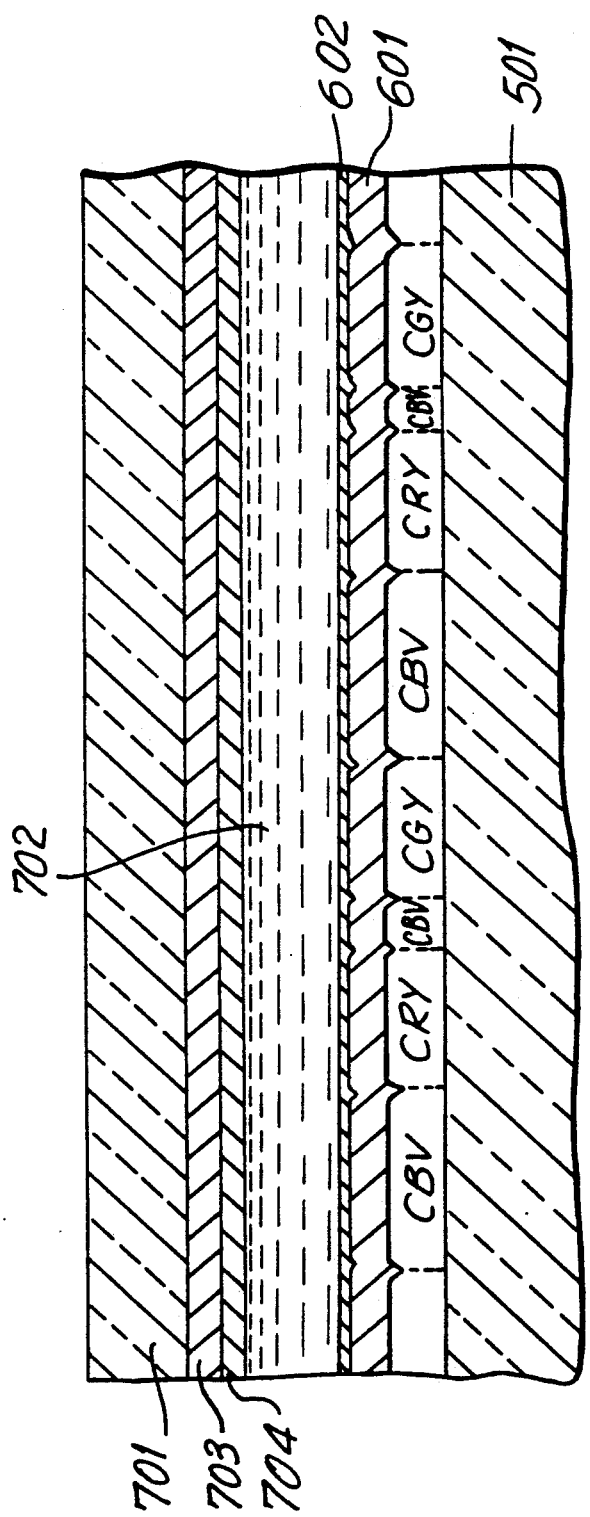
FIG. 7 is a cross-sectional view of a liquid crystal display device including the color filter electrode substrate of FIG. 6.

A color filter electrode substrate 610 shown in FIG. 6 was prepared by applying a polyamide, acrylic, epoxy or urethane resin on the color filters to form a flattened film 601, and then forming a transparent conductive film ITO 602 by sputtering. When this substrate is used in a liquid crystal display device, a device 710 as in FIG. 7 is constructed. Device 710 includes substrate 610 and opposed electrode substrate 701 with a liquid crystal material 702 therebetween. A transparent ITO electrode 703 is selectively deposited on substrate 701 with a polyamide orientation layer 704 thereon. Device 710 in a double layer STN device provides a uniform display with a high shading efficiency of 1:20 or more in contrast ratio.

It will thus be seen that the objects set forth above, among those made apparent from the preceding description, are efficiently attained and, since certain changes may be made in carrying out the above method and in the construction set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A liquid crystal display device, comprising:
   a first transparent substrate;
   pixels of at least three primary colors selectively disposed on the substrate so that one pixel of each color is adjacent to each other, each pixel of negative photoresist material, wherein the pixels are spaced apart from each other and all the spaces between pixels are filled with negative photoresist material tinted with the last of the colors formed;
   a polymer film disposed on the pixels;
   a transparent electrode disposed on the polymer film;
   a second opposed electrode substrate having electrodes selectively disposed thereon spaced apart from the first substrate; and
   a liquid crystal material in the space between the electrode substrates.

2. A color filter substrate for a liquid crystal display device, comprising:
   a transparent substrate;
   pixels of at least three primary colors selectively disposed on the substrate so that one pixel of each color is adjacent to each other, each pixel of negative photoresist material, wherein the pixels are spaced apart from each other and all the spaces between pixels are filled with negative photoresist material tinted with the last of the colors formed;
a polymer film disposed on the pixels; and
a transparent electrode disposed on the polymer film.

3. A method of forming a plurality of color filters of at least two colors on a transparent substrate, comprising:
selectively depositing a plurality of pixels of at least a first color on the transparent substrate leaving portions of the surface of the substrate exposed;
depositing a film of negative photoresist material of a color different than the pixels formed on the substrate over the formed pixels and the exposed surface of the substrate;
exposing the substrate surface opposed to the surface having the pixels thereon to a light source at a wavelength which is blocked by the color of the formed pixels and at an intensity sufficient to develop the negative photoresist material directly on the transparent substrate; and
removing the unexposed and undeveloped portions of the negative photoresist material deposited on the formed pixels.

4. The method of claim 3, wherein there are color filters of the three primary colors of red, green and blue and the color of the filter formed by exposure of the opposed surface having the pixels thereon is one of red, green and blue.

5. The method of claim 3, including the step of flattening the surface of the pixels by adjusting the exposure of the negative resist of the last color filters formed.

6. The method of claim 3, including the step of placing a filter between the light source and the substrate for selectively filtering the light to be at a wavelength which is blocked by the colors of each of the formed pixels so that light is not transmitted to the negative resist on the surface of the formed pixels.

7. The method of claim 3, wherein the light source is an ultra-high voltage mercury arc lamp.

8. The method of claim 3, further including the step of depositing an oxygen block film on the negative resist material before exposure.

* * * * *